United States Patent
Guenther

(10) Patent No.: US 11,255,879 B2
(45) Date of Patent: Feb. 22, 2022

(54) MEASURING DEVICE AND MEASURING METHOD WITH SELECTIVE STORAGE OF DATA SEGMENTS

(71) Applicant: Rohde & Schwarz GmbH & Co. KG, Munich (DE)

(72) Inventor: Thomas Guenther, Waldenburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 269 days.

(21) Appl. No.: 15/720,302

(22) Filed: Sep. 29, 2017

(65) Prior Publication Data
US 2019/0101571 A1   Apr. 4, 2019

(51) Int. Cl.
*G01R 13/02* (2006.01)
*G06F 3/06* (2006.01)

(52) U.S. Cl.
CPC ....... *G01R 13/0272* (2013.01); *G06F 3/0608* (2013.01); *G06F 3/0652* (2013.01); *G06F 3/0673* (2013.01)

(58) Field of Classification Search
CPC . G01R 13/0272; G06F 3/0652; G06F 3/0608; G06F 3/0673
See application file for complete search history.

(56) References Cited

U.S. PATENT DOCUMENTS

| | | | | |
|---|---|---|---|---|
| 6,297,760 B1* | 10/2001 | Hungerbuehler | ......... | G06F 5/00 341/155 |
| 7,822,471 B2* | 10/2010 | Bowers | ......... | A61B 5/046 600/513 |
| 10,107,718 B2* | 10/2018 | Wewers | ......... | G01M 15/02 |
| 2003/0060992 A1* | 3/2003 | Ebert | ......... | G06K 9/00523 702/66 |
| 2007/0118317 A1* | 5/2007 | Corredoura | ......... | G01R 13/0254 702/79 |
| 2007/0156945 A1* | 7/2007 | Nakata | ......... | G11B 20/10 711/4 |
| 2007/0226406 A1* | 9/2007 | Beale | ......... | G01R 13/029 711/110 |
| 2013/0158923 A1* | 6/2013 | Stanton | ......... | G01R 23/18 702/76 |
| 2014/0047198 A1* | 2/2014 | Stein | ......... | G01R 13/0254 711/154 |
| 2014/0236539 A1* | 8/2014 | Lehane | ......... | G06F 17/00 702/190 |

(Continued)

FOREIGN PATENT DOCUMENTS

EP    1462809 A1    9/2004

*Primary Examiner* — Michael J Dalbo
(74) *Attorney, Agent, or Firm* — Potomac Technology Law, LLC

(57) ABSTRACT

A measuring device comprises a first interface, which is adapted to receive a first measuring signal. The measuring device further comprises an acquisition memory, which is adapted to store at least one data segment of the first measuring signal. The measuring device further comprises an analyzer, which is connected to the acquisition memory, and is adapted to analyze the at least one data segment of the first measuring signal and generate a first analysis result therefrom. The measuring device further comprises a memory controller, which is adapted to either keep, in the acquisition memory, or discard, the at least one data segment based upon the first analysis result.

11 Claims, 5 Drawing Sheets

(56) References Cited

U.S. PATENT DOCUMENTS

2015/0293170 A1\* 10/2015 Knierim ............. G01R 13/0254
  702/124
2017/0171671 A1\* 6/2017 Smith .................... H04R 25/30

\* cited by examiner

US 11,255,879 B2

MEASURING DEVICE AND MEASURING METHOD WITH SELECTIVE STORAGE OF DATA SEGMENTS

TECHNICAL FIELD

The present invention relates to measuring devices, such as oscilloscopes, and associated measuring methods.

BACKGROUND

The amount of data captured by measuring devices, such as oscilloscopes, has significantly increased in recent years. With increased bandwidth and sample size, very large data amounts needed to be handled. In a typical test, during most of the measuring time, insignificant measuring results are produced. These insignificant measurement results though require the same amount of storage space as significant measurement results. This leads to the problem that either very large storage memory is necessary, or only a short time duration of measurement results can be stored.

For example, the U.S. Pat. No. 6,297,760B1 shows a data acquisition system, which performs an analysis of each individual sample before storing it. Only if the value of the sample is of interest, for example if it exceeds a threshold, it is stored.

This system significantly reduces the necessary amount for storing the measuring results. At the same time, the system is disadvantageous, since only very basic analysis functions can be performed. This leads to a sub-optimal data reduction, or to loss of valuable data.

What is needed, therefore, is an approach for a measuring device that facilitates a detailed data analysis while at the same time significantly reducing the amount of necessary storage.

Some Example Embodiments

Embodiments of the present invention advantageously address the foregoing requirements and needs, as well as others, by providing a measuring device and a measuring method that facilitate a detailed data analysis while at the same time significantly reducing the amount of necessary storage.

According to a first aspect of the invention, a measuring device is provided. The measuring device comprises a first interface, which is adapted to receive a first measuring signal. The measuring device further comprises an acquisition memory, which is adapted to store at least one data segment of the first measuring signal. The measuring device further comprises an analyzer, which is connected to the acquisition memory and is adapted to analyze the at least one data segment of the first measuring signal and to generate a first analysis result therefrom. The measuring device further comprises a memory controller, which is adapted to either keep in the acquisition memory, or discard, the at least one data segment based on the first analysis result. This allows for significantly reducing the amount of recorded data, while allowing for detailed analysis.

According to a further embodiment of the first aspect, the analysis result is a decision to keep or to discard the analyzed data segment. This allows for very simple further processing.

According to a further embodiment of the first aspect, a data segment comprises a plurality of measurement samples. Additionally or alternatively, a data segment comprises all measurement samples, upon which a momentary screen read-out of the measuring device is based. Additionally or alternatively, a data segment comprises 10,000 samples to 20,000,000 samples, for example, at a sample width of 10 bit. This significant size of the data segment allows for thorough analysis with regard to the necessity to keep or discard the data segment.

According to a further embodiment of the first aspect, the acquisition memory comprises a ring buffer. This allows for a very simple data handling.

According to a further embodiment of the first aspect, the memory controller is adapted to either increase a memory pointer determining a storage location in the acquisition memory, or keep the memory pointer unchanged based on the first analysis result. This allows for a very simple processing of the analysis result.

According to a further embodiment of the first aspect, the memory controller is adapted to overwrite a data segment if the memory pointer is kept unchanged. This allows for overwriting a storage area within the memory without any processing effort.

According to a further embodiment of the first aspect, the analysis comprises one or more of a mask test, a parameter test, a mean value test, a peek-peek-value test, a period-frequency test, an amplitude test, a fast Fourier transformation, a spectrum value test, and a maximum spectrum value test. A very diverse and accurate analysis is thereby possible.

According to a further embodiment of the first aspect, the measuring device comprises a second interface, which is adapted to receive a second measuring signal. The acquisition memory is then adapted to store at least one data segment of the second measuring signal. This allows for processing two measuring signals, which might be interrelated, in parallel.

According to a further embodiment of the first aspect, the memory controller is adapted to jointly keep or discard both the at least one data segment of the first measuring signal and the at least one data segment of the second measuring signal, based on the analysis result of the first measuring signal. Even when only analyzing the first measuring signal, the memory controller may still keep both measuring signals, so as later on to analyze both signals, when an event occurs, which warrants a storage of the first measuring signal.

According to a further embodiment of the first aspect, the analyzer is adapted to analyze the at least one data segment of the second measuring signal and generate a second analysis result. The memory controller is adapted to jointly keep both the at least one data segment of the first measuring signal and the at least one data segment of the second measuring signal, if either the first analysis result or the second analysis result requires storage. The memory controller is adapted to jointly discard both the at least one data segment of the first measuring signal and the at least one data segment of the second measuring signal, if both the first analysis result and the second analysis result require discarding. This allows for analyzing events occurring in both measuring signals.

According to a further embodiment of the first aspect, if the memory controller jointly keeps both the at least one data segment of the first measuring signal and the at least one data segment of the second measuring signal, the memory controller is adapted to store them with an identical time base. This significantly simplifies the analysis later on.

According to a further embodiment of the first aspect, the acquisition memory is adapted to consecutively store a plurality of data segments of the first measuring signal. The analyzer is adapted to analyze each of the plurality of data segments of the first measuring signal and to generate a first analysis result for each of the plurality of data segments. The memory controller is adapted to, if the analysis result of one of the plurality of data segments indicates to keep the one of the plurality of data segments, to keep the one of the plurality of data segments, keep at least one data segment directly preceding the one of the plurality of data segments and keep at least one data segment directly succeeding the one of the plurality of data segments. This allows for analyzing preceding and succeeding data segments around a data segment warranting storage.

According to a further embodiment of the first aspect, the analyzer is adapted to operate with a time delay with regard to storing by the acquisition memory, resulting in the first analysis result being available only after the time delay. The memory controller is then adapted to initially store the at least one date segment in the acquisition memory. The memory controller is then adapted to, if the first analysis result indicates a discarding of the first data segment, release a memory section of the acquisition memory in which the at least one data segment is stored. This allows for an offline analysis allowing for a higher data processing speed in total.

According to a further embodiment of the first aspect, the analyzer is adapted to analyze a plurality of time-staggered data segments in parallel. The memory controller is then adapted to keep or release data segments in the acquisition memory, as the first analysis result of the respective data segment is provided by the analyzer. This reduces the necessary data storage further.

According to a second aspect of the invention, a measuring method is provided. The method comprises receiving a first measuring signal storing at least one data segment thereof, analyzing the at least one data segment of the first measuring signal, generating a first analysis result therefrom, and keeping or discarding the at least one data segment based on the first analysis result. This allows for significantly reducing the amount of recorded data, while allowing for detailed analysis.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A measuring device and a measuring method, which facilitate a detailed data analysis while at the same time significantly reducing the amount of necessary storage, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

As will be appreciated, a processor, unit, module or component (as referred to herein) may be composed of software component(s), which are stored in a memory or other computer-readable storage medium, and executed by one or more processors or CPUs of the respective devices. As will also be appreciated, however, a module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

The construction and function of different examples of a measuring device according to example embodiments of the present invention are described below with reference to FIGS. 1-4. Then, an example measuring method according to example embodiments of the present invention is described with reference to FIG. 5. Similar entities and reference number in different figures have been partially omitted.

Reference will now be made in detail to example embodiments of the present invention, examples of which are illustrated in the accompanying drawings. However, the following embodiments of the present invention may be variously modified and the range of the present invention is not limited by the following embodiments.

Figure 1:
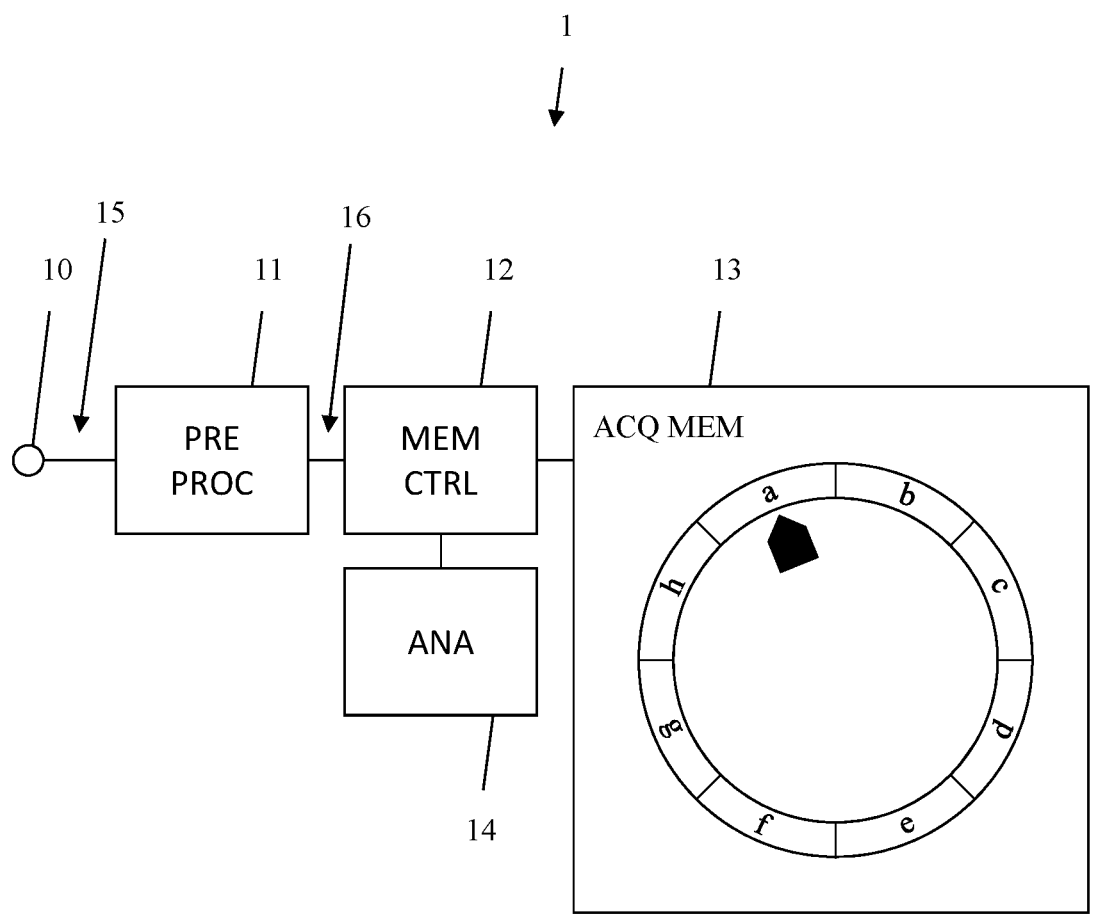
FIG. 1 shows a first example of a measuring device in accordance with example embodiments of the present invention.

FIG. 1 shows a first example of a measuring device 1 in accordance with example embodiments of the present invention. The measuring device 1 comprises a first interface 10 connected to a preprocessor 11, which in turn is connected to a memory controller 12. The memory controller 12 is connected to an acquisition memory 13 and to an analyzer 14.

The first interface 10 is adapted to receive a first measuring signal 15. By way of example, the first measuring signal may be an analog high frequency signal. The first measuring signal 15 is processed by the preprocessor 11. By way of example, the preprocessor 11 reduces the frequency of the first measuring signal 15, performs filtering and performs digitizing, resulting in a digital first measuring signal 17, which consists of a plurality of data segments. Each data segment comprises a plurality of measurement samples. By way of example, a data segment may comprise all measurement samples, upon which a momentary screen readout of the measuring device is based. By way of further example, a data segment comprises 10,000-20,000,000 samples at a sample width of 8-16 bits. Specifically, the sample width may be 10 bits.

The memory controller 12 hands on these data segments to the analyzer 14, which performs an analysis. The analysis serves the purpose of deciding whether the respective data segment needs to be kept or can be discarded. By way of example, the analysis comprises a mask test, and/or a parameter test, and/or a mean value test, and/or a peak-peak-value test, and/or a period/frequency test, and/or an amplitude test, and/or a fast Fourier transformation, and/or a spectrum value test, and/or a maximum spectrum value test. It is thereby possible to perform a very thorough analysis of the data segment. Further, an analysis result is generated. The analysis result consists of the decision either to keep or to discard the respective data segment. The analysis result is handed back to the memory controller 12.

The data segment is also stored in the acquisition memory 13, by the memory controller 12. By way of example, a data pointer points to a storage location a, as depicted in FIG. 1. Therefore, a present data segment is stored in the memory location a. After the analysis result has been returned, if the data segment is to be discarded, the memory controller 12 keeps the memory pointer at the storage location a, and overwrites it with the next data segment. Alternatively, if the analysis result indicates that the data segment needs to be kept, the memory controller 12 changes the memory pointer to point to the next storage location b, so that the next data segment is stored there and the data segment stored at the location a is maintained.

Further, the preprocessing by the preprocessor 12 also comprises a triggering which is not to be confused with a later following analysis by the analyzer 14. The triggering serves the purpose of finding a part of the signal that is to be analyzed. The analysis itself is significantly more complex than the triggering. By way of example, the analysis allows for quantitative statements with regard to the signal.

Figure 2:
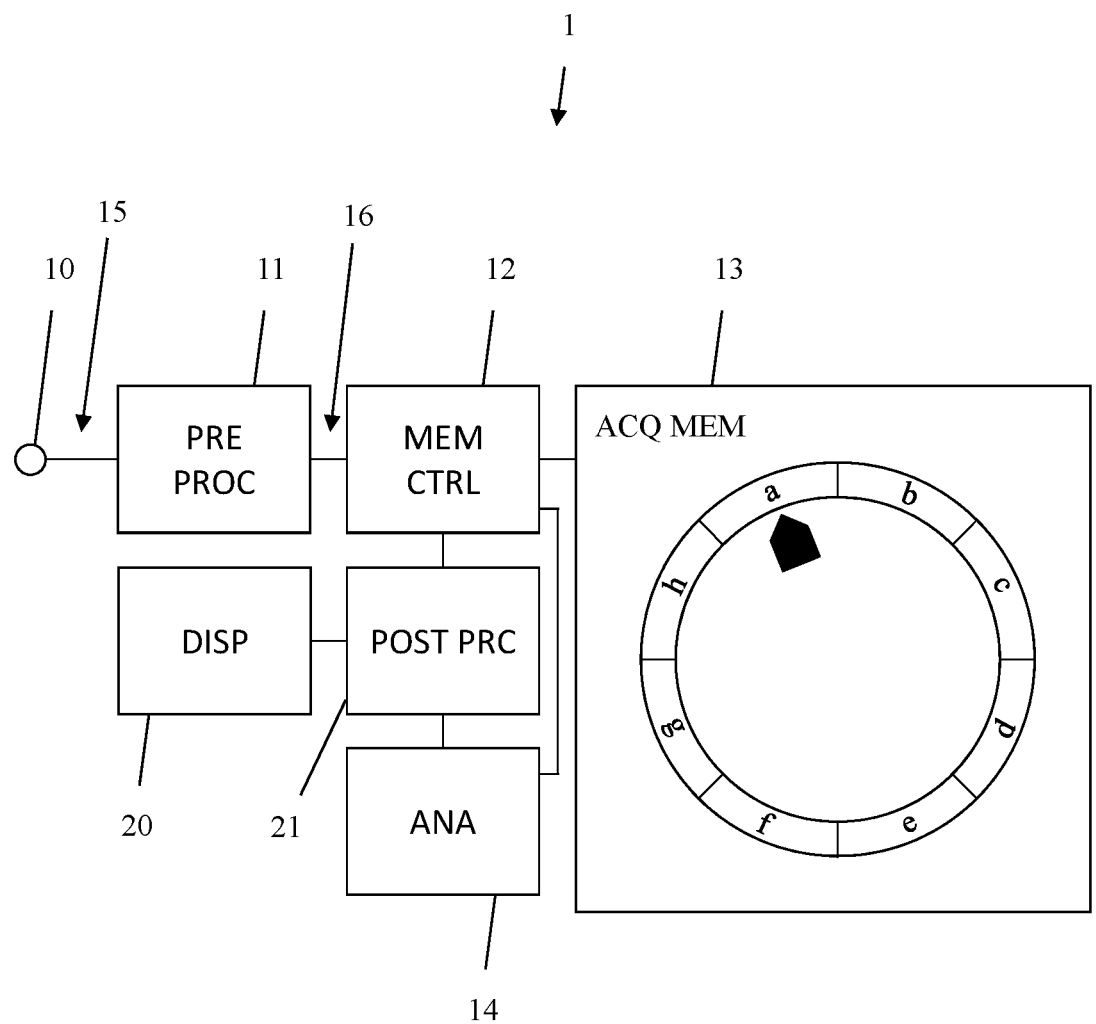
FIG. 2 shows a second example of a measuring device in accordance with example embodiments of the present invention.

FIG. 2 shows a second example of a measuring device 1 in accordance with example embodiments of the present invention. With reference to FIG. 2, a post processor 21 is inserted between the memory controller 12 and the analyzer 14. The post processor 21 performs a post processing on the acquired signal segment. By way of example, the post processing comprises a Fourier transformation and/or a mask test. Also, a curve plotting can be part of the post processing. Moreover, the post processing can comprise any image processing necessary for displaying measuring results.

Additionally a display 20 is depicted. The display is connected to the post processor 21. The display displays measuring results provided by the post processor 21.

The results of the post processing are not necessarily stored in the memory 13, although this is possible through a connection between the post processor 21 and the memory 13 (not shown in the Figure).

Further, the analyzer 14 can use the information provided by the memory controller (the signal segment) to perform the analysis. Moreover, the analyzer 14 can use results of the post processor 21 as input values of the analysis.

The further examples of the measuring device described below are compatible and can be implemented with the features shown in FIG. 2. By way of example, the foregoing use of the post processor 21 and the display 20 may be implemented together with any of the further examples of the measuring device described below.

Figure 3:
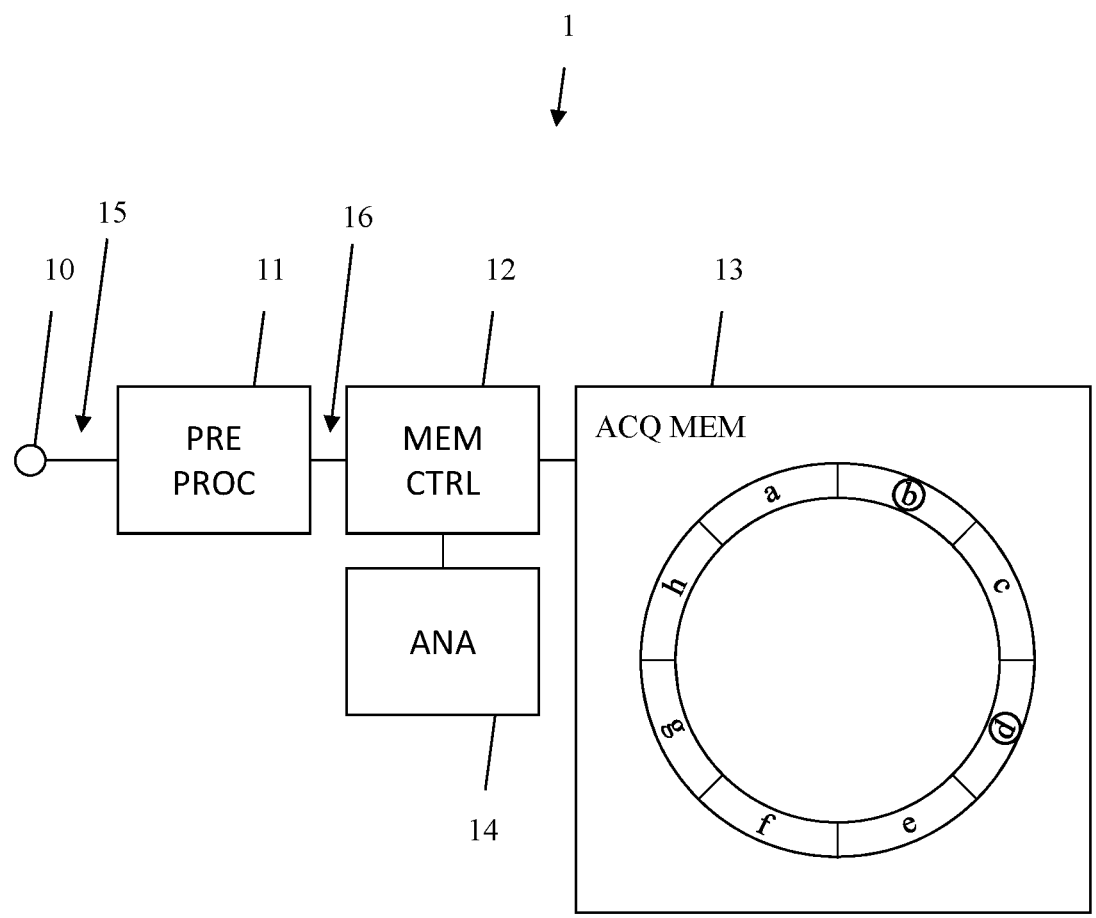
FIG. 3 shows a third example of a measuring device in accordance with example embodiments of the present invention.

FIG. 3 shows a third example of a measuring device in accordance with example embodiments of the present invention. The analysis by the analyzer 14 can require a significant amount of time, which could result in a time delay of the analysis result. If the analysis result is not available when the data segment is completely stored and the next data segment begins, the memory controller 12 will not know how to proceed. By way of example, the memory controller 12 of FIG. 1 may not be capable of properly deciding whether to keep the memory pointer at the same storage location or move the memory pointer to the next storage location.

The example measuring device 1 of FIG. 3 solves this issue. In the example of FIG. 3, the memory controller 12 no longer operates with a memory pointer (as shown in FIG. 1). Instead, the memory controller 12 consecutively writes the data segments into the storage locations (e.g., the locations a-h) within the acquisition memory 13. Further, the memory controller 12 provides the data segments to the analyzer 14, which analyzes them. By way of example, the analysis may be performed in a parallel manner. The data segments may be analyzed as they are made available to the analyzer 14, and the time delays of the individual data segments would thus stagger within the analyzer 14. As soon as the time delay of an analysis is over, the analysis result is available. At this time, a number of further data segments may have already been stored in the acquisition memory. As soon as the decision to either keep or discard a data segment is made available by the analyzer 14, if the decision is to discard the respective data segment, the memory controller 12 can then release the respective section of memory. The released section of memory can then later on be used for storing a different data segment. As shown in FIG. 3, the data stored in the storage locations a and d are marked as "released." Although the content is not yet purged, it can be overwritten by the following data segments.

Figure 4:
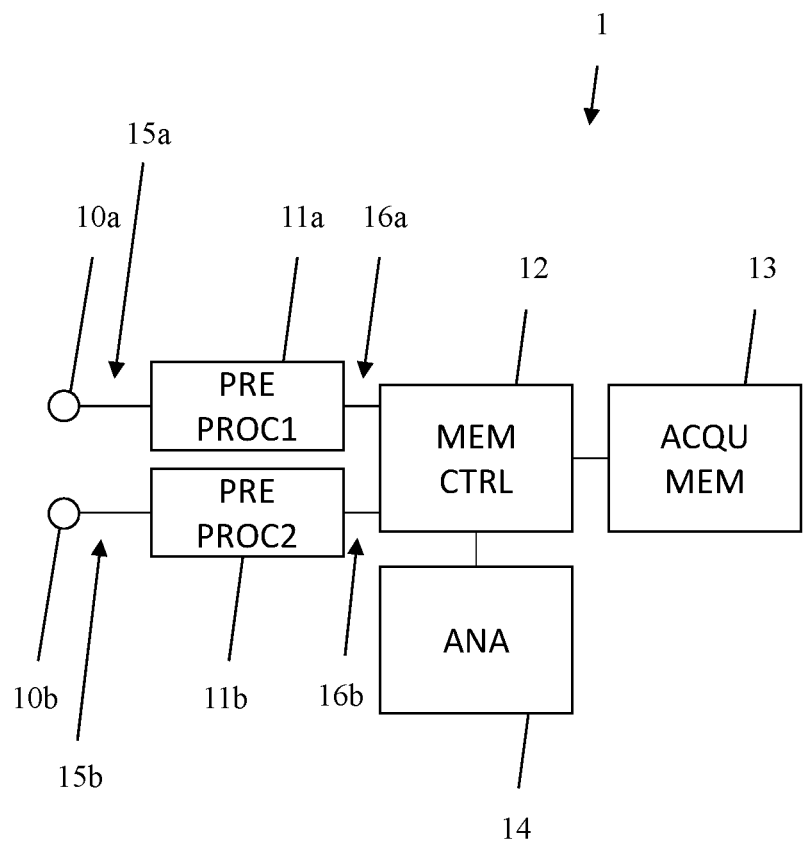
FIG. 4 shows a fourth example of a measuring device in accordance with example embodiments of the present invention.

FIG. 4 shows a fourth example of a multi-channel measuring device 1 in accordance with example embodiments of the present invention. The measuring device 1 comprises a first interface 10a, connected to a first preprocessor 11a, which in turn is connected to the memory controller 12. The measuring device 1 further comprises a second interface 10b, which is connected to a second preprocessor 11b, which in turn is connected to the memory controller 12. Both channels perform essentially the same functions. A first measuring signal 15a is input through the first interface 10a and preprocessed by the preprocessor 11a. A digital first measuring signal 16a is provided to the memory controller 12. A second measuring signal 15b is input through the second interface 10b and preprocessed by the second preprocessor 11b. A digital second measuring signal 16b is handed to the memory controller 12.

The memory controller 12 stores a data segment of the first measuring signal and a data segment of the second measuring signal in the acquisition memory with a same time basis. The analyzer 14 analyzes either only one or both of the data segments in order to determine if these data segments need to be kept or can be discarded. In case of an analysis of both data segments, both data segments are kept. Further, even in case of the analysis of only one of the data segments, both data segments will still be required to be stored and maintained. Only when the analysis of both data segments results in an indication to discard, both data segments are discarded.

According to further example embodiments, measuring devices with more than the depicted two channels may be implemented, where the function for three, four or even more channels would follow that of the described two-channel embodiment.

Figure 5:
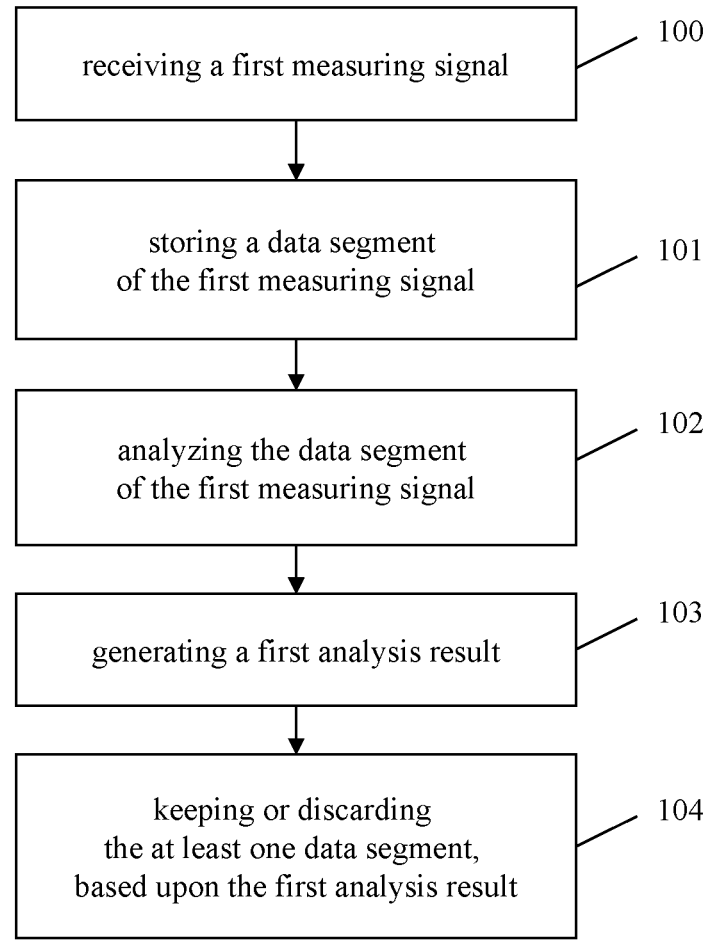
FIG. 5 shows a flow diagram of a measuring method in accordance with example embodiments of the present invention.

FIG. 5 shows an flow diagram of a measuring method in accordance with example embodiments of the present invention. In step 100, a first measuring signal is received. In step 101, at least one data segment of the first measuring signal is stored. In step 102, the at least one data segment of the first measuring signal is analyzed. In step 103, a first analysis result is generated. In step 104, the at least one data segment is kept or discarded based on the first analysis result.

The measuring method shown in FIG. 5 very closely corresponds in its details to the measuring device shown in FIGS. 1-4. All aspects discussed with reference to FIGS. 1-4 are also valid with regard to the measuring method shown in FIG. 5.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the specific measuring device shown here. Not only oscilloscopes, but also other measuring devices, such as for example watch analyzers, vector network analyzers, etc. can be used in conjunction with the present invention.

Although the present invention and its advantages have been described in detail, it should be understood, that various changes, substitutions and alterations can be made herein without departing from the spirit and scope of the invention as defined by the appended claims.

What is claimed is:

1. A measuring device comprising:
a first interface adapted to receive a first measuring signal;
a preprocessor adapted to process the first measuring signal to generate a digital first measurement signal comprising a plurality of data segments, and to perform triggering of the first measuring signal to determine a part of the first measuring signal to be analyzed;
an acquisition memory adapted to store at least one data segment of the first measuring signal, wherein the at least one data segment of the first measuring signal comprises at least all measurement samples upon which a momentary screen readout of the measuring device is based, and a range of 10,000 to 20,000,000 measurement samples of the first measuring signal;
a processor, connected to the acquisition memory, adapted to analyze the at least one data segment of the first measuring signal, and to generate a first analysis result based on the analysis of the at least one data segment of the first measuring signal, and wherein the processor is adapted to analyze a plurality of time-staggered data segments of the first measuring signal in parallel; and
a memory controller adapted to control the acquisition memory, based on the first analysis result, either to maintain the at least one data segment of the first measuring signal therein or to discard the at least one data segment of the first measuring signal; and
wherein the memory controller is adapted to control the acquisition memory, as a first analysis result of a respective one of the time-staggered data segments of the first measuring signal is released by the processor, to discard the respective one of the time-staggered data segments stored in the acquisition memory, when the first analysis result generated by the processor indicates a decision to discard the respective one of the time-staggered data segments, and
wherein the analysis of the at least one data segment of the first measuring signal comprises one or more of a mask test, a mean value test, a peak-peak-value test, a period/frequency test, a fast Fourier transformation, a spectrum value test, and a maximum spectrum value test.

2. The measuring device according to claim 1, wherein the analysis result consists of a decision whether to keep or discard the at least one data segment of the first measuring signal.

3. The measuring device according to claim 1, wherein the acquisition memory comprises a ring buffer.

4. The measuring device according to claim 1, wherein the measuring device further comprises:
a second interface adapted to receive a second measuring signal; and
wherein the acquisition memory is adapted to store at least one data segment of the second measuring signal.

5. The measuring device according to claim 4, wherein the memory controller is adapted to control the acquisition memory, based on the first analysis result, either to maintain both the at least one data segment of the first measuring signal and the at least one data segment of the second measuring signal, or to discard both the at least one data segment of the first measuring signal and the at least one data segment of the second measuring signal.

6. The measuring device according to claim 4, wherein:
the processor is adapted to analyze the at least one data segment of the second measuring signal, and to generate a second analysis result based on the analysis of the at least one data segment of the second measuring signal;
the memory controller is adapted to control the acquisition memory, if either of the first analysis result and the second analysis result indicates that the respective at least one data segment is to be kept, to maintain both the at least one data segment of the first measuring signal and the at least one data segment of the second measuring signal therein; and
the memory controller is adapted to control the acquisition memory, if each of the first analysis result and the second analysis result indicates that the respective at least one data segment is to be discarded, to discard both the at least one data segment of the first measuring signal and the at least one data segment of the second measuring signal.

7. The measuring device according to claim 6, wherein, when either of the first analysis result and the second analysis result indicates that the respective at least one data segment is to be kept, the memory controller is adapted to control the acquisition memory to maintain both the at least one data segment of the first measuring signal and the at least one data segment of the second measuring signal with a same time basis.

8. The measuring device according to claim 1, wherein:
the acquisition memory is adapted to consecutively store a plurality of data segments of the first measuring signal;
the processor is adapted to analyze each of the plurality of data segments of the first measuring signal, and to generate a respective analysis result for each of the plurality of data segments of the first measuring signal;
the memory controller is adapted to control the acquisition memory, when the respective analysis result of a one of the plurality of data segments of the first measuring signal indicates to keep the one of the plurality of data segments of the first measuring signal, to maintain the one data segment of the first measuring signal therein, to maintain at least one data segment preceding the one data segment of the first measuring signal therein, and to maintain at least one data segment following the one data segment of the first measuring signal therein.

9. The measuring device according to claim 1, wherein the processor is adapted to operate based on a time delay with regard to the storage of at least one of the at least one data segment of the first measuring signal, resulting in the first analysis result being available after the time delay, wherein the memory controller is adapted to initially store the at least one data segment of the first measuring signal in the acquisition memory, and wherein the memory controller is adapted to control the acquisition memory, when the first analysis result indicates that the at least one data segment of the first measuring signal is to be discarded, to release a memory section of the acquisition memory in which the at least one data segment of the first measuring signal is stored.

10. A measuring method comprising:
receiving, by a measuring device, a first measuring signal;
processing the first measuring signal to generate a digital first measurement signal comprising a plurality of data segments, and performing triggering of the received first measuring signal to determine a part of the received first measuring signal to be analyzed;
storing, within a memory of the measuring device, at least one data segment of the first measuring signal, wherein the at least one data segment of the first measuring signal comprises at least all measurement samples upon which a momentary screen readout of the measuring device is based, and a range of 10,000 to 20,000,000 measurement samples of the first measuring signal;
analyzing the at least one data segment of the first measuring signal, wherein analyzing of a plurality of time-staggered data segments of the first measuring signal is performed in parallel;
generating a first analysis result based on the analysis of the at least one data segment of the first measuring signal; and
maintaining the at least one data segment of the first measuring signal within the memory of the measuring device or discarding the at least one data segment of the first measuring signal, based on the first analysis result,
wherein, as a first analysis result of a respective one of the time-staggered data segments of the first measuring signal is released by the processor, the respective one of the time-staggered data segments stored in the memory are discarded when the first analysis result generated by the processor indicates a decision to discard the respective one of the time-staggered data segments; and
wherein the analysis of the at least one data segment of the first measuring signal comprises one or more of a mask test, a mean value test, a peak-peak-value test, a period/frequency test, a fast Fourier transformation, a spectrum value test, and a maximum spectrum value test.

11. The measuring method according to claim 10, wherein the analysis result consists of a decision whether to keep or discard the at least one data segment of the first measuring signal.

* * * * *